(12) United States Patent
Kim

(10) Patent No.: US 10,903,842 B2
(45) Date of Patent: Jan. 26, 2021

(54) DEVICE AND METHOD WITH CLOCK FREQUENCY SUPPLY

(71) Applicant: Samsung Electronics Co., Ltd., Suwon-si (KR)

(72) Inventor: Seong Joong Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/520,621

(22) Filed: Jul. 24, 2019

(65) Prior Publication Data

US 2020/0195254 A1 Jun. 18, 2020

(30) Foreign Application Priority Data

Dec. 14, 2018 (KR) .................. 10-2018-0162009

(51) Int. Cl.
*H03L 7/089* (2006.01)
*H04B 5/00* (2006.01)
*H04L 7/033* (2006.01)
*H04L 27/02* (2006.01)

(52) U.S. Cl.
CPC ......... *H03L 7/0891* (2013.01); *H04B 5/0062* (2013.01); *H04L 7/0331* (2013.01); *H04L 27/02* (2013.01)

(58) Field of Classification Search
CPC ......... H04B 1/40; H04B 1/0475; H04B 1/525
See application file for complete search history.

(56) References Cited

U.S. PATENT DOCUMENTS

| | | | |
|---|---|---|---|
| 6,369,647 B1 * | 4/2002 | Main | H03B 5/24 329/301 |
| 8,985,390 B2 | 2/2015 | Heinrich et al. | |
| 9,071,283 B2 | 6/2015 | Shana'a et al. | |
| 9,124,413 B2 | 9/2015 | Savoj | |
| 9,379,784 B2 | 6/2016 | Dhayni | |
| 9,515,750 B2 | 12/2016 | Mofidi et al. | |
| 9,893,716 B2 | 2/2018 | Chakraborty et al. | |
| 9,998,178 B2 | 6/2018 | Dedieu et al. | |

(Continued)

FOREIGN PATENT DOCUMENTS

| | | |
|---|---|---|
| CA | 3 036 533 A1 | 3/2018 |
| JP | 2002-208972 A | 7/2002 |
| JP | 5023965 B2 | 9/2012 |
| JP | 5323517 B2 | 10/2013 |
| JP | 5717412 B2 | 5/2015 |
| KR | 10-2014-0039507 A | 4/2014 |

OTHER PUBLICATIONS

Morris et al., "A 90nm CMOS 13.56MHz NFC Transceiver", *IEEE Asian Solid-State Circuits Conference*, Nov. 2009, pp. 25-28 (4 pages in English).

(Continued)

*Primary Examiner* — Shuwang Liu
*Assistant Examiner* — Gina M McKie
(74) *Attorney, Agent, or Firm* — NSIP Law

(57) ABSTRACT

A clock frequency supply device includes: a frequency tuner configured to receive an input signal with a carrier frequency, and tune an oscillation frequency of an oscillator based on the carrier frequency; an injector configured to inject the input signal directly into the oscillator after the tuning of the oscillation frequency is completed; and an oscillator configured to generate a reference clock signal with a reference clock frequency based on the injected input signal.

27 Claims, 13 Drawing Sheets

(56) References Cited

U.S. PATENT DOCUMENTS

| | | | | |
|---|---|---|---|---|
| 2006/0239312 | A1* | 10/2006 | Kewitsch | H01S 5/42 |
| | | | | 372/29.023 |
| 2008/0100385 | A1* | 5/2008 | Lin | H03L 7/099 |
| | | | | 331/16 |
| 2016/0248468 | A1 | 8/2016 | Greiner et al. | |
| 2017/0201281 | A1 | 7/2017 | Kim et al. | |
| 2018/0006655 | A1 | 1/2018 | Kim et al. | |
| 2018/0048263 | A1* | 2/2018 | Yun | H03B 5/1243 |

OTHER PUBLICATIONS

Lien et al., "A Self-Calibrating NFC SoC with a Triple-Mode Reconfigurable PLL and a Single-Path PICC-PCD Receiver in 0.11 µm CMOS", *IEEE International Solid-State Circuits Conference Digest of Technical Papers (ISSCC)*, 2014, pp. 158-159 ( 3 pages in English).

Dişken, Gökay, et al. "Speaker Model Clustering to Construct Background Models for Speaker Verification." Archives of Acoustics, 42,2017 (9 pages in English).

Jati, Arindam, et al. "Speaker2Vec: Unsupervised Learning and Adaptation of a Speaker Manifold Using Deep Neural Networks with an Evaluation on Speaker Segmentation." *INTERSPEECH*, 2017 (5 pages in English).

Li, Lantian, et al. "Decision making based on cohort scores for speaker verification." 2016 *Asia-Pacific Signal and Information Processing Association Annual Summit and Conference(APSIPA)*. IEEE, 2016 (4 pages in English).

Extended European Search Report dated May 26, 2020 in counterpart European Patent Application No. 19201858.8 (12 pages in English).

European Patent Office Action dated Jun. 4, 2020 in corresponding European Patent application No. 19213780.0 (8 pages in English).

\* cited by examiner

DEVICE AND METHOD WITH CLOCK FREQUENCY SUPPLY

CROSS-REFERENCE TO RELATED APPLICATIONS

This application claims the benefit under 35 USC § 119(a) of Korean Patent Application No. 10-2018-0162009 filed on Dec. 14, 2018 in the Korean Intellectual Property Office, the entire disclosure of which is incorporated herein by reference for all purposes.

BACKGROUND

1. Field

The following description relates to a device and method with clock frequency supply.

2. Description of Related Art

In low-power wireless communications (for example, a wireless sensor node and a telemetry), the size and charge of a battery may be limited, and thus a super low-power wireless transceiver may be advantageous. In low-power wireless communications, a frequency synthesizer (for example, a phase locked loop (PLL) or a voltage-controlled oscillator (VCO)) may consume a majority of power used by a wireless transmission chip.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a clock frequency supply device includes: a frequency tuner configured to receive an input signal with a carrier frequency, and tune an oscillation frequency of an oscillator based on the carrier frequency; an injector configured to inject the input signal directly into the oscillator after the tuning of the oscillation frequency is completed; and an oscillator configured to generate a reference clock signal with a reference clock frequency based on the injected input signal.

The device may include a gate configured to deactivate the frequency tuner in response to the tuning of the oscillation frequency of the oscillator being completed.

For the deactivating of the frequency tuner, the gate may be configured to restrict a supply of the carrier frequency to the frequency tuner in response to the tuning of the oscillation frequency being completed.

For the generating of the reference clock signal, the oscillator may be configured to generate the reference clock signal to have a reference clock frequency locked to the carrier frequency of the input signal, while a magnitude of an envelope of the input signal is greater than a threshold value.

For the generating of the reference clock signal, the oscillator may be configured to generate the reference clock signal to have a free running frequency through free running in a frequency configuration tuned by the frequency tuner, while a magnitude of an envelope of the input signal is less than or equal to a threshold value.

The injector may include: a signal magnitude adjuster configured to adjust a magnitude of the input signal; and an ON/OFF switch configured to control feeding of a low pass filtered feed signal to the oscillator.

The injector may be configured to feed the feed signal to a bias current control node of the oscillator.

The injector may include: a resistor connected in series between an antenna and the oscillator; and a capacitor connected in parallel to the resistor.

The injector may be configured to: restrict an enablement of the feed signal before the tuning of the oscillation frequency is completed, and allow the enablement of the feed signal after the tuning of the oscillation frequency is completed.

The injector may include an amplifier, a capacitive divider, and a mode switch.

For the tuning of the oscillation frequency, the frequency tuner may be configured to tune the oscillation to minimize a frequency difference between the carrier frequency and the oscillation frequency.

The frequency tuner may include: a first tuning controller configured to coarsely tune the oscillation frequency of the oscillator based on the carrier frequency and the oscillation frequency; and a second tuning controller configured to finely tune the oscillation frequency of the oscillator based on the carrier frequency and the oscillation frequency.

The first tuning controller may be configured to determine a bit value within a first bit range among control bits to control the oscillation frequency based on a result of comparing a target oscillation count counted during a coarse mask time corresponding to the oscillation frequency to a reference oscillation count corresponding to the carrier frequency.

The second tuning controller may be configured to determine a bit value within a second bit range among control bits to control the oscillation frequency based on a result of comparing a target oscillation count counted during a fine mask time corresponding to the oscillation frequency to a reference oscillation count corresponding to the carrier frequency.

For the tuning of the oscillation frequency, the frequency tuner may be configured to tune the oscillation frequency by changing at least one of a capacitance of the oscillator and a bias current flowing in the oscillator.

For the tuning of the oscillation frequency, the frequency tuner may be configured to tune the oscillation frequency to the carrier frequency before a data signal is received.

The device may include a clock adjuster configured to provide a communicator with either one or both of the reference clock signal and a target clock signal generated by tuning the reference clock frequency of the reference clock signal to a target clock frequency.

The may include a communicator configured to receive a data signal after the tuning of the oscillation frequency is completed.

The communicator may be configured to transmit and receive the data signal through a near field communication (NFC) band.

In another general aspect, a clock frequency supply method includes: receiving an input signal with a carrier frequency; tuning an oscillation frequency of an oscillator based on the carrier frequency; injecting the input signal directly into the oscillator after the tuning of the oscillation frequency is completed; and generating a reference clock signal with a reference clock frequency based on the injected input signal.

In another general aspect, a clock frequency supply method includes: receiving an input signal with a carrier frequency; tuning an oscillation frequency of an oscillator based on the carrier frequency; and injection locking the oscillation frequency to the carrier frequency to generate a reference clock signal, in response to the tuning of the oscillation frequency being completed.

The injection locking may include injecting comprises injecting the input signal into the oscillator while the frequency tuner is being deactivated.

The generating of the reference clock signal may include generating the reference clock signal to have a frequency tuned to the carrier frequency during a time period in which a carrier of the input signal is not present.

The tuning of the oscillation frequency may include: tuning the oscillator to a first target oscillation frequency by transferring a control bit sequence to the oscillator; comparing a reference oscillation count corresponding to the carrier frequency to an oscillation count of the oscillator oscillating at the target oscillation frequency; adjusting the control bit sequence based on a result of the comparing; and tuning the oscillator to a second target oscillation frequency by transferring the adjusted control bit sequence to the oscillator Other features and aspects will be apparent from the following detailed description, the drawings, and the claims.

Figure 1:
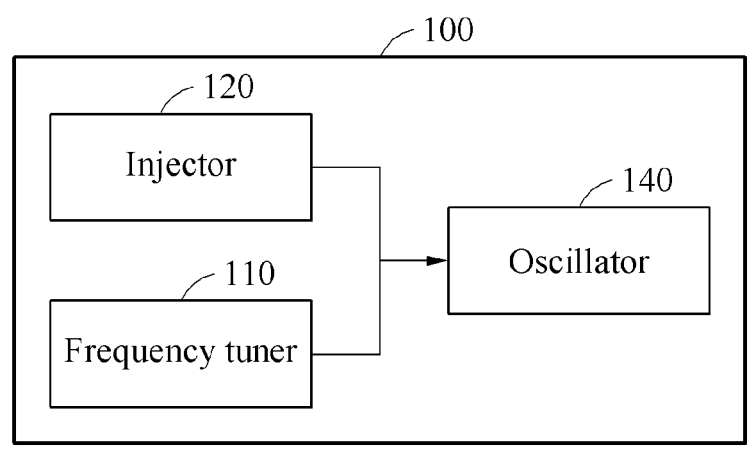
FIG. 1 illustrates an example of a clock frequency supply device.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

Hereinafter, some examples will be described in detail with reference to the accompanying drawings. However, the scope of the present disclosure is not limited by the examples. Like reference numerals in the drawings denote like elements.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms including technical and scientific terms used herein have the same meaning as commonly understood by one of ordinary skill in the art to which this disclosure pertains and after an understanding of the disclosure of this application. It will be further understood that terms, such as those defined in commonly-used dictionaries, should be interpreted as having a meaning that is consistent with their meaning in the context of the relevant art and the disclosure of this application, and are not to be interpreted in an idealized or overly formal sense unless expressly so defined herein.

When describing the examples with reference to the accompanying drawings, like reference numerals refer to like constituent elements and a repeated description related thereto will be omitted. In the description of examples, detailed description of well-known related structures or functions will be omitted when it is deemed that such description will cause ambiguous interpretation of the present disclosure.

The use of the term "may" herein with respect to an example or embodiment (e.g., as to what an example or embodiment may include or implement) means that at least one example or embodiment exists where such a feature is included or implemented, while all examples are not limited thereto. As used herein, the term "and/or" includes any one and any combination of any two or more of the associated listed items.

In one or more embodiments of the present disclosure, an overall power consumption in low-power wireless communications is reduced, compared to typical low-power wireless communications, by having blocks that consume less power than blocks of the typical low-power wireless communications.

FIG. 1 illustrates an example of a clock frequency supply device.

Referring to FIG. 1, a clock frequency supply device 100 includes a frequency tuner 110, an injector 120, and an oscillator 140.

The frequency tuner 110 receives an input signal with a carrier frequency, and tunes an oscillation frequency of the oscillator 140 based on the carrier frequency. The input signal may be a signal received from an external device through an antenna. The carrier frequency may be a frequency of a near field communication (NFC) band, for example, 13.56 megahertz (MHz). However, the carrier frequency of the input signal is not limited thereto. An example of the frequency tuner 110 will be described further below with reference to FIG. 7.

The injector 120 injects the input signal directly into the oscillator 140 after the tuning of the oscillation frequency by the frequency tuner 110 is completed. For example, the injector 120 may inject the input signal into a bias-associated node of the oscillator 140. An example of the injector 120 will be described further below with reference to FIG. 6.

The oscillator 140 generates an oscillation signal. The oscillator 140 generates the oscillation signal with an oscillation frequency determined based on a capacitance of the oscillator 140 and a bias current flowing in the oscillator 140. The oscillation signal may be used as a clock signal for an operation of another block. For example, the oscillator 140 may generate a reference clock signal with a reference clock frequency based on the injected input signal. An example of the oscillator 140 will be described further below with reference to FIG. 12.

The clock frequency supply device 100 may further include a gate. The gate may deactivate the frequency tuner 110 in response to the tuning of the oscillation frequency of the oscillator 140 being completed. For example, the gate may transfer the input signal to the frequency tuner 110 while the oscillation frequency is being tuned. The gate may block the transfer of the input signal to the frequency tuner 110 when the tuning of the oscillation frequency is completed to deactivate the frequency tuner 110. An example of the gate will be described further below with reference to FIG. 11.

The clock frequency supply device 100 of one or more embodiments may advantageously reduce a power consumption by deactivating the frequency tuner 110 after the tuning of the oscillation frequency is completed. Further, the clock frequency supply device 100 may transfer the carrier frequency of the input signal to the oscillator 140 through the injector 120, while the frequency tuner 110 is being deactivated, thereby maintaining the oscillation frequency of the oscillator 140 to be a frequency identical or similar to the carrier frequency. Thus, the clock frequency supply device 100 may generate an accurate clock frequency with low power consumption, and utilize the clock frequency for a communication module, for example. The clock frequency supply device 100 of one or more embodiments may advantageously reduce a calibration time (including a time to tune the oscillation frequency, for example) and an energy consumption. Further, the clock frequency supply device 100 of one or more embodiments may implement frequency locking with a simplified structure compared to a structure of a typical clock frequency device.

Hereinafter, a method of providing a clock frequency with low power consumption by the clock frequency supply device 100 will be described with reference to FIG. 2.

Figure 2:
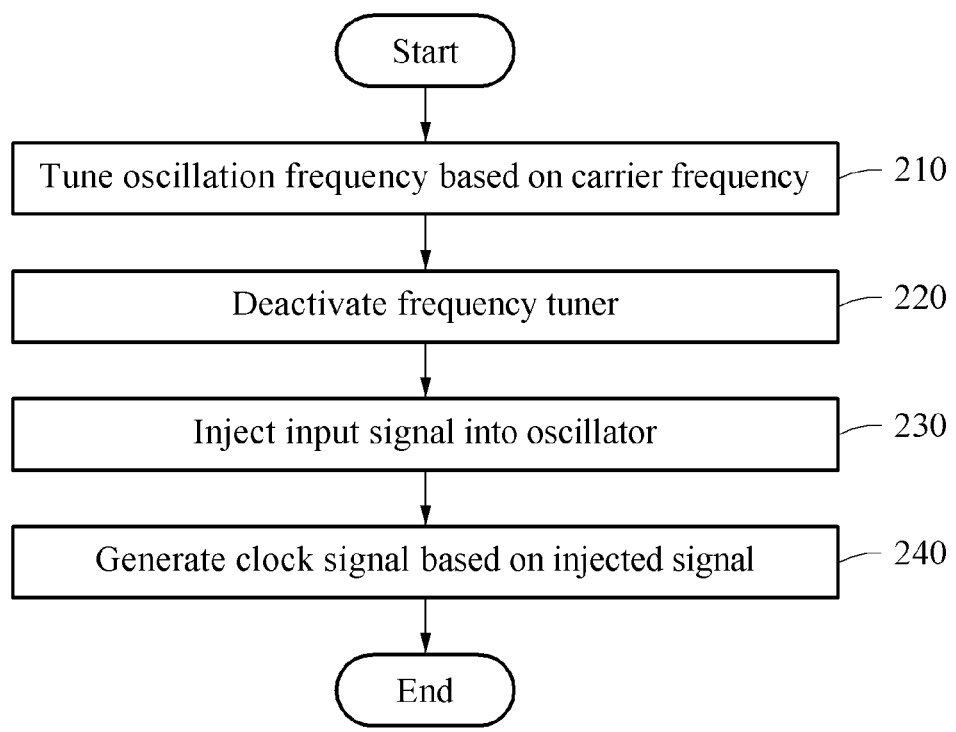
FIG. 2 illustrates an example of a clock frequency supply method.

FIG. 2 illustrates an example of a clock frequency supply method.

First, a clock frequency supply device receives an input signal with a carrier frequency through an antenna.

In operation 210, the clock frequency supply device tunes (using a frequency tuner, for example) an oscillation frequency of an oscillator based on the carrier frequency.

In operation 220, the clock frequency supply device deactivates the frequency tuner. For example, the clock frequency supply device may restrict a transfer of the carrier frequency to the frequency tuner using a gate to deactivate the frequency tuner, in response to the tuning of the oscillation frequency of the oscillator being completed.

In operation 230, the clock frequency supply device injects the input signal directly into the oscillator after the tuning of the oscillation frequency is completed. For example, the clock frequency supply device may feed a feed signal generated from the input signal using the injector to a bias current control node of the oscillator through an injector.

In operation 240, the clock frequency supply device generates a reference clock signal with a reference clock frequency based on the injected input signal (the feed signal, for example). In a non-limiting example, the clock frequency supply device may provide the reference clock signal to a communicator, such as a hardware communications module, and the communicator may perform an operation associated with communication based on the reference clock signal. Herein, the clock frequency supply device may also be a device, such as a mobile phone, that includes the communicator.

Figure 3:
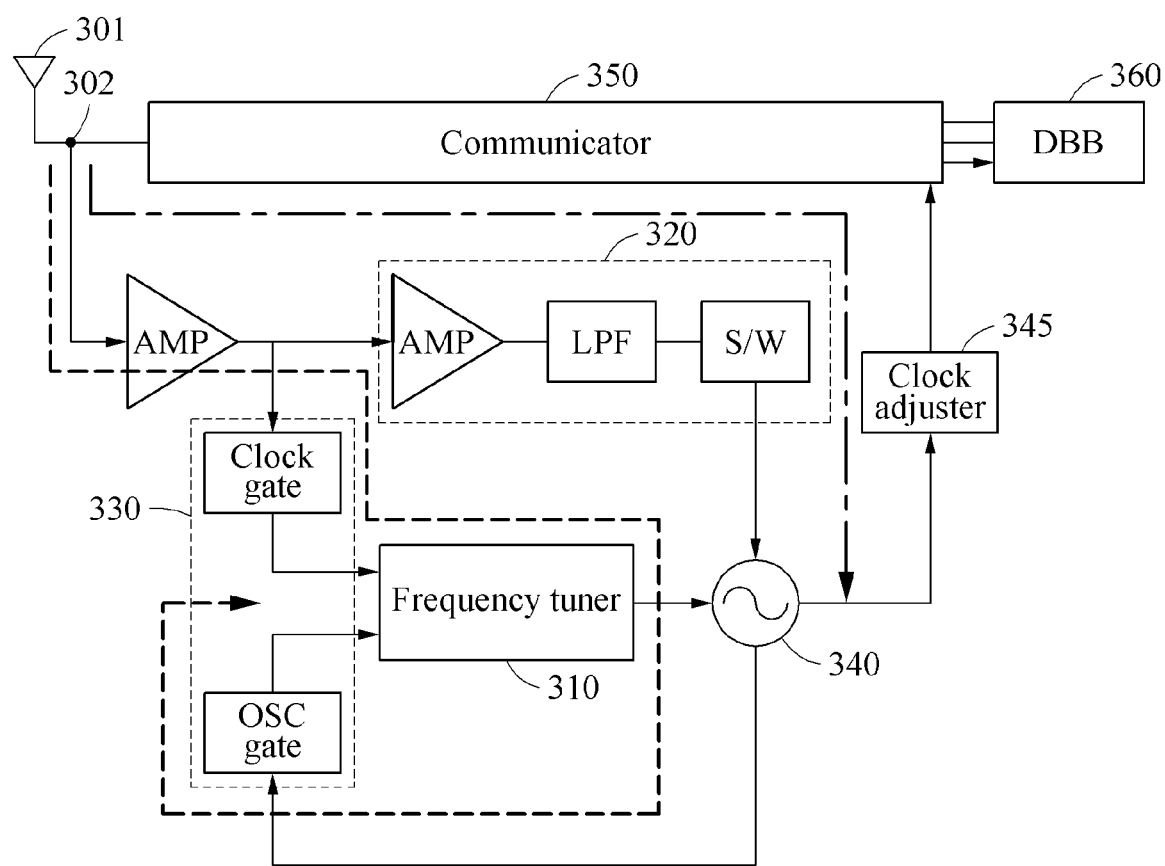
FIG. 3 illustrates an example of a clock frequency supply device.
Figure 4:
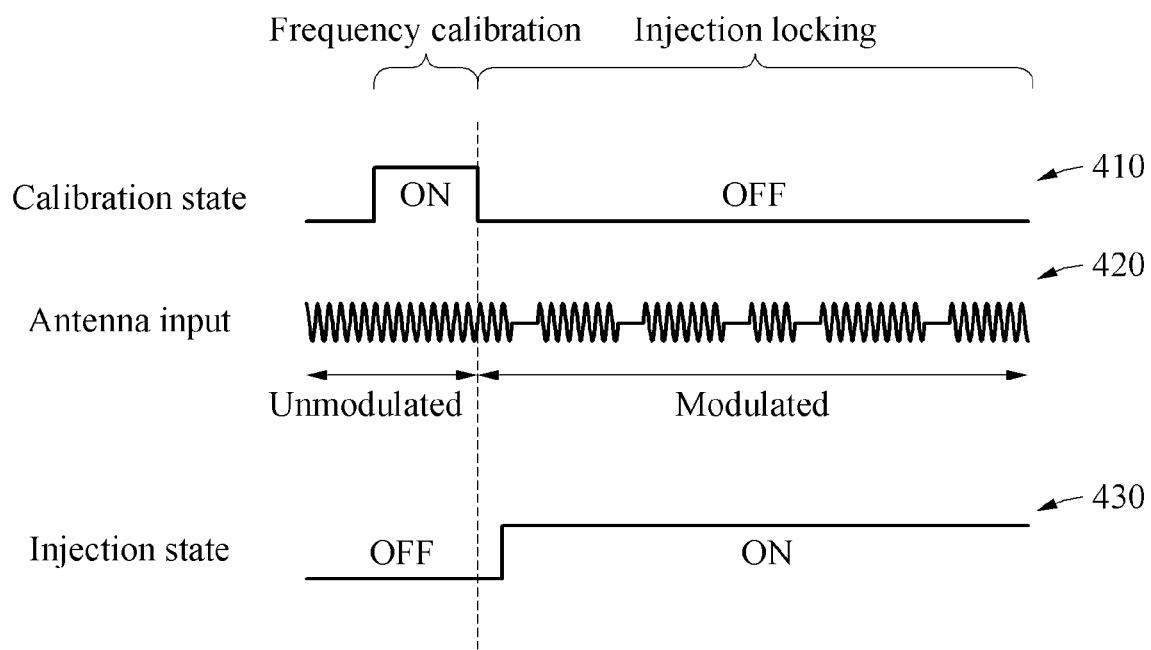
FIG. 4 illustrates an example of an operation of a clock frequency supply device.

FIG. 3 illustrates an example of a clock frequency supply device. FIG. 4 illustrates an example of an operation of a clock frequency supply device.

Referring to FIG. 3, a clock frequency supply device 300 may include a frequency tuner 310, an injector 320, a gate 330, an oscillator 340, a communicator 350, and a digital baseband (DBB) unit 360.

First, the clock frequency supply device 300 receives a signal (receives a signal from an external device through an antenna 301, for example). The signal received from the external device may be referred to as an antenna input 420. The antenna input 420 is a signal with a carrier frequency. The received antenna input 420 may thus exist at the illustrated node 302 of the antenna 301. Herein, the input signal may be a signal denoting the antenna input 420. However, examples are not limited thereto. The input signal (the signal with a carrier frequency) may be a signal received from the external device.

For reference, in FIG. 4, a calibration state signal 410 and an injection state signal 430 are signals indicating operating states of a current circuit. For example, the calibration state signal 410 is a signal indicating whether the frequency tuner 310 is operating in an activation state. The injection state signal 430 is a signal indicating whether the circuit is injection-locked.

Before the oscillation frequency of the oscillator 340 is tuned, the clock frequency supply device 300 transfers the input signal received through the antenna 301 to the frequency tuner 310. The frequency tuner 310 tunes the oscillation frequency to minimize a difference between the oscillation frequency of the oscillator 340 and the carrier frequency of the input signal (the antenna input 420, for example). For example, the frequency tuner 310 may tune the oscillation frequency to the carrier frequency before receiving a data signal (a data signal including a modulated signal, for example). In this example, the input signal received by the clock frequency supply device 300 in a frequency calibration mode may be an unmodulated signal. The frequency calibration mode indicates a state in which the frequency tuner 310 is activated.

After the tuning of the oscillation frequency is completed, the clock frequency supply device 300 transfers the input signal received through the antenna 301 (the antenna input 420, for example) to the injector 320. The injector 320 generates a feed signal by filtering the input signal with the carrier frequency. The injector 320 feeds the feed signal to the oscillator 340. In this example, the input signal received by a frequency supply device in an injection locking mode may be a modulated signal. Thus, during a period in which a carrier of the input signal exists, the oscillator 340 is injection-locked at the carrier frequency of the input signal (due to the feed signal fed to the oscillator 340, for example). The injection locking mode indicates a state in which the oscillator 340 is injection-locked or free running. During a period in which a carrier of the input signal does not exist (or is not present, for example), the oscillator 340 is free running at a frequency calibrated in the frequency calibration mode, for example, a frequency tuned by the frequency tuner.

A frequency range in which the oscillator 340 is locked to the carrier frequency of the input signal is controlled based on a magnitude of a signal injected into the oscillator 340 (the feed signal, for example). As the magnitude of the signal injected into the oscillator 340 increases, the frequency locking range widens. Thus, in operation 210 of one or more embodiments of the application, a spec margin with respect to a frequency error and a frequency jitter may be alleviated. For example, due to the widened frequency locking range resulting from the increased magnitude of the feed signal injected into the oscillator 340, the oscillator 340 may be advantageously injection-locked at the carrier frequency even when the frequency tuner 310 does not fully minimize a difference between the oscillation frequency and the carrier frequency during tuning due to either one or both of the presence of a frequency error/jitter and a decreased calibration time (a decreased tuning time of the frequency tuner 310, for example). By injection locking by a decreased calibration time, the clock frequency supply device 100 may advantageously reduce a power consumption.

The oscillator 340 generates an oscillation signal with a final reference clock frequency in response to the feed signal of an injection locking path after the frequency tuner 310 tunes the oscillation frequency of the oscillator 140 to be close to the carrier frequency of the input signal. The oscillator 340 may provide the communicator 350 with a reference clock signal including the reference clock frequency through a clock adjuster 345.

The clock adjuster 345 may bypass the reference clock signal generated by the oscillator 340, or may provide the communicator 350 with a division signal generated by dividing a frequency of the reference clock signal. For example, the clock adjuster 345 may provide the communicator with the reference clock signal or a target clock signal generated by tuning the reference clock frequency of the reference clock signal to a target clock frequency of the target clock signal. The target clock signal is the division signal generated by dividing the reference clock signal.

The communicator 350 may modulate a digital signal (a data signal, for example) received from the DBB unit 360 to a frequency of a communication band (for example, a near field frequency) or may demodulate an external signal (a data signal, for example) received at the frequency of the communication band to a base band (BB). For example, the communicator may transmit and receive the data signal through an NFC band. The communicator 350 may receive the data signal after the tuning of the oscillation frequency is completed.

The DBB unit 360 may transfer a digital signal for communication to the communicator 350, or may receive a digital signal from the communicator 350.

Figure 5:
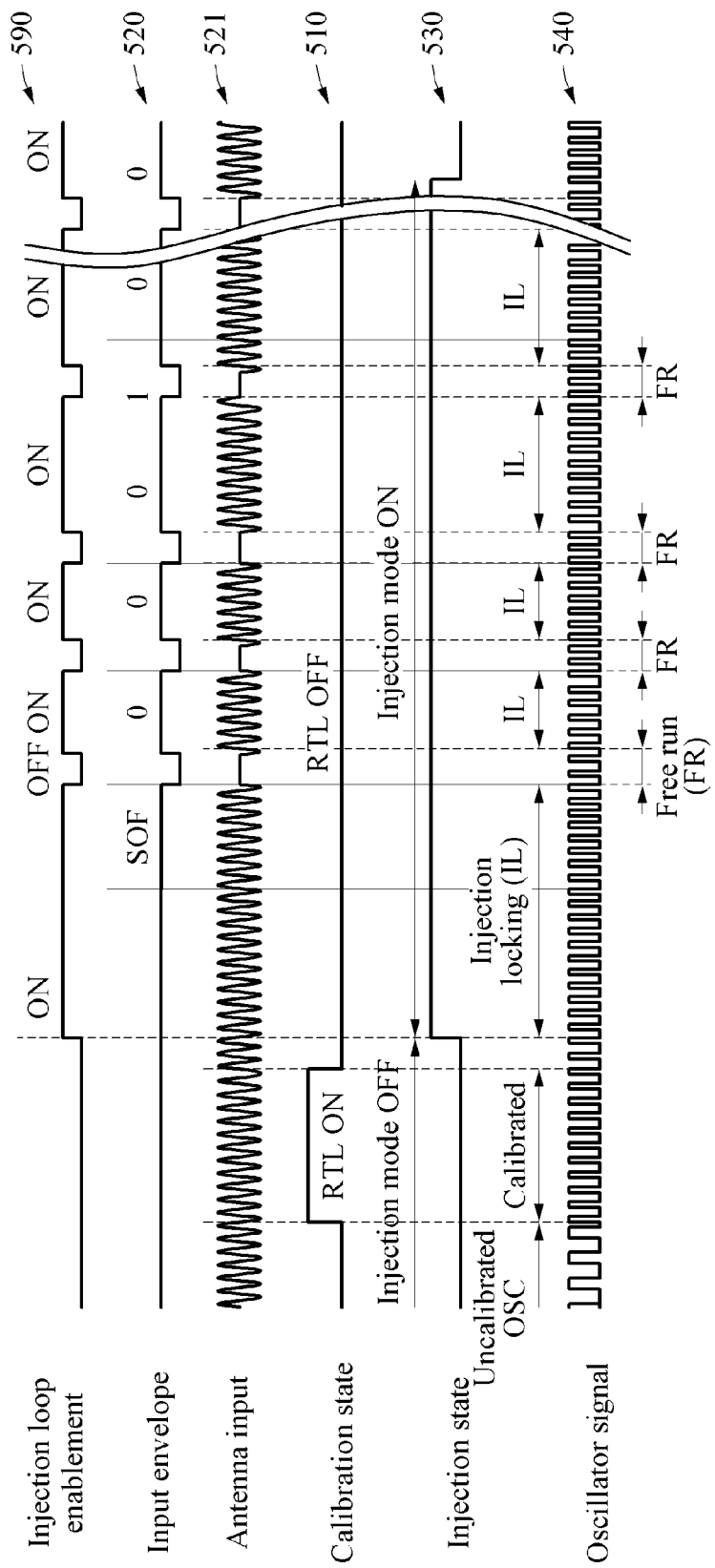
FIG. 5 illustrates an example of an operation of a clock frequency supply device.

FIG. 5 illustrates an example of an operation of a clock frequency supply device.

As shown in FIG. 5, an antenna input 521 is a signal with a carrier frequency. The antenna input 521 includes an unmodulated signal before a data frame, and includes a modulated signal in a data frame period after a start of frame (SOF). A signal including a data frame is referred to as a data signal. An input envelope 520 is an envelope with respect to the unmodulated signal before the SOF and thus, includes only a logical state of H. After the SOF, the input envelope 520 is an envelope with respect to the modulated signal and thus, may include a logical state of H or L (for example, a logic state of 1 or 0, respectively).

For reference, in FIG. 5, the input envelope 520 indicates an upper envelope of the antenna input 521. An envelope is a signal outlining a waveform of a signal. Herein, when a magnitude of the antenna input 521 is greater than a threshold value, a logical state of the input envelope 520 corresponding thereto is indicated as H, and when the magnitude of the antenna input 521 is less than or equal to the threshold value, a logical state of the input envelope 520 corresponding thereto is indicated as L. In FIG. 5, the input envelope 520 with the logical state of H has a magnitude of a maximum amplitude, and the input envelope 520 with the logical state of L has a magnitude of "0" or a magnitude similar to "0".

In the antenna input 521, the data frame may include data modulated using modified Miller coding. For example, an occurrence of a pause frame after at least two consecutive unmodulated frames appear (for example, frames in which the logical state of the input envelope is H) indicates a start of the data frame. Here, a frame before the pause frame indicates an SOF. For reference, according to modified Miller coding, a frame in which a 0 bit appears after a 0 bit in a data sequence represents a switch to a logical state L at an edge of the frame and then a switch to a logical state H. A frame in which a 0 bit appears after a 1 bit represents a maintenance of the logical state H during the corresponding frame. A frame in which a 1 bit appears represents a switch to a logical state L in the middle of the frame and then a switch to a logical state H, irrespective of a previous frame (for example, irrespective of whether a previous bit is a 0 bit or a 1 bit). When Miller coding is used, a period in which the logical state of the input envelope is H appears at a higher frequency than a period in which the logical state of the input envelope is L.

For reference, in FIG. 5, a calibration state signal 510 is a signal indicating whether a frequency tuner (the frequency tuner 110 or 310, for example) is operating in an activation state. An injection state signal 530 is a signal indicating whether a circuit is injection-locked (for example, indicating whether the oscillator 140 or 340 is injection-locked at the carrier frequency of the antenna input 521).

A clock frequency supply device tunes an oscillation frequency of an oscillator through a frequency tuner. For example, the clock frequency supply device 100 or 300 tunes an oscillation frequency of the respective oscillator 140 or 340 through the respective frequency tuner 110 or 310. For example, as shown in FIG. 5, an oscillation signal 540 may indicate an uncalibrated oscillation signal (uncalibrated OSC) 540. The frequency tuner may calibrate the oscillation signal 540 such that the oscillation frequency of the oscillation signal 540 matches the carrier frequency.

In an injection locking mode, an injector (the injector 120 or 320, for example) supplies the antenna input 521 to the oscillator. However, the injector may lock the oscillation frequency of the oscillator to the carrier frequency only during a period in which a magnitude of an envelope of the antenna input 521 is greater than a threshold value in the injection locking mode. For example, an injection loop enablement state 590 indicates a period of time in which the clock frequency supply device performs an injection locking operation. In a period in which the injection loop enablement state 590 is ON, the clock frequency supply device may perform injection locking. In a period in which the injection loop enablement state 590 is OFF, the clock frequency supply device may perform a free running frequency operation.

For example, in FIG. 5, an injection locking period (denoted as IL in FIG. 5) is a period in which a magnitude of an envelope of an input signal is greater than a threshold value (for example, a period in which a logical state of the input signal is H). During the injection locking period, the injector may inject the antenna input 521 directly into the oscillator, thereby locking the oscillation frequency of the oscillator to the carrier frequency, which will be hereinafter referred to as the injection locking operation. A free running period (denoted as FR in FIG. 5) is a period in which the magnitude of the envelope of the input signal is less than or equal to the threshold value (for example, a period in which the logical state of the input envelope is L). During the free running period, the oscillator operates at a free running frequency, which will be hereinafter referred to as the free running frequency operation. The clock frequency supply device may repeat the injection locking operation in each injection locking period IL in which the logical state of the input envelope is H, and repeat the free running frequency operation in each free running period FR in which the logical state of the input envelope is L. As described above, according to Miller coding, a period in which the logical state of the input envelope is H appears at a higher frequency than a period in which the logical state of the input envelope is L, and there is no period in which the logical state of the input envelope is maintained to be L. Thus, since the free running period FR is shorter than the injection locking period IL and the free running period FR is not continued, the clock frequency supply device maintains the oscillation frequency tuned to the carrier frequency. Further, in an example, only a single inverter consumes power while the injection locking operation is performed, and therefore the clock frequency supply device maintains the tuned oscillation frequency with low power consumption (for example, power lower than 1 mW).

For reference, a modulation depth indicates a ratio of a voltage of a logical state L to a voltage of a logical state H in an input envelope. When the modulation depth is 100%, the voltage of the logical state L is "0". Even when the modulation depth is 100%, the clock frequency supply device may maintain the oscillation frequency of the oscillator similar to the carrier frequency by repeating the injection locking operation and the free running frequency operation.

The clock frequency supply device generates the oscillation signal 540 (generated as described above) as a reference clock signal, and may provide another module (for example, a communicator such as the communicator 350) with the generated reference clock signal.

Figure 6:
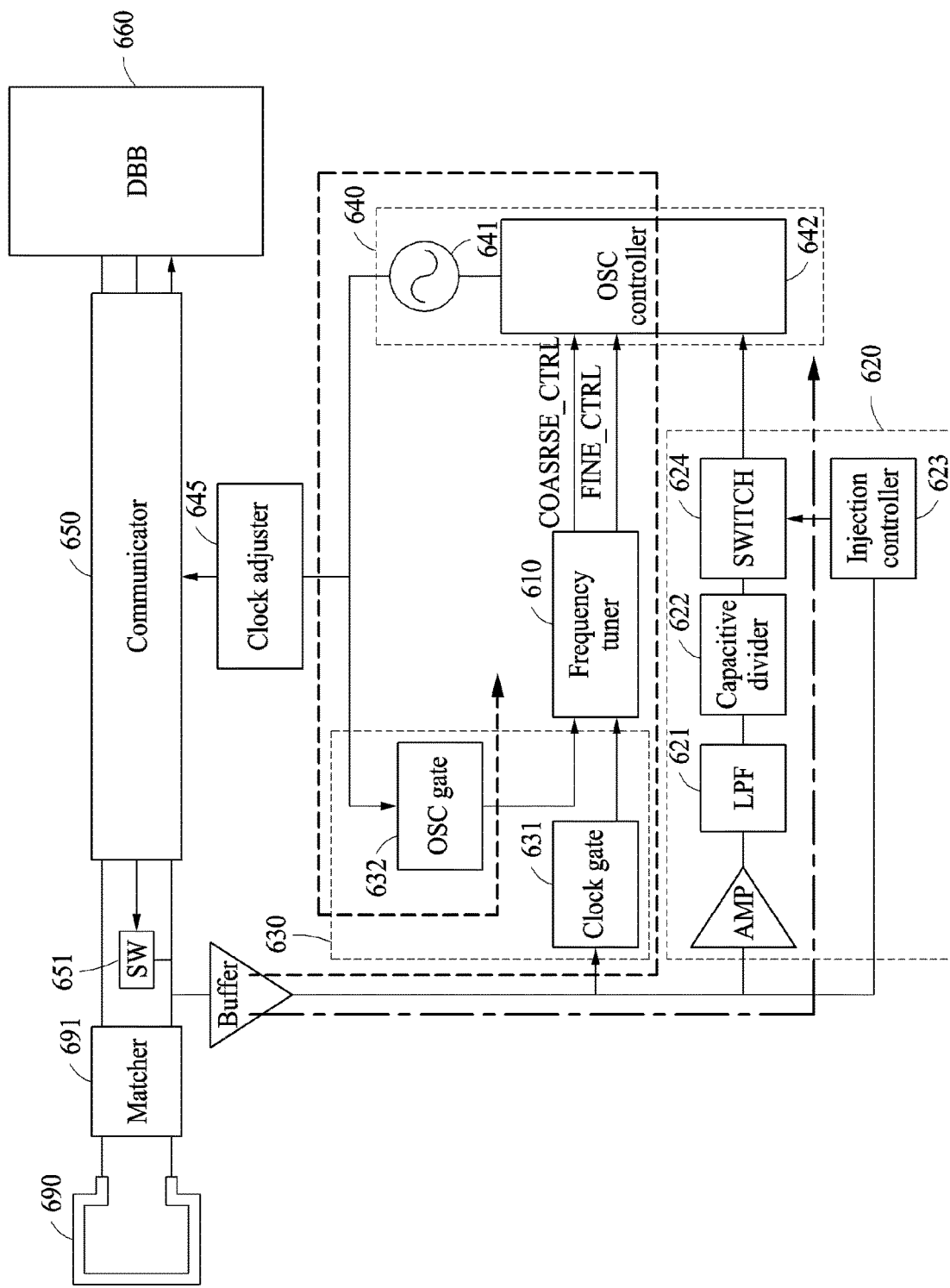
FIG. 6 illustrates an example of an injector and a clock frequency supply device.

FIG. 6 illustrates an example of an injector and a clock frequency supply device.

A frequency tuner 610 determines a control bit to control an oscillation frequency of an oscillator 640. For example, the frequency tuner 610 determines a first control bit COARSE_CTRL to tune a coarse frequency component of the oscillation frequency, and determines a second control bit FINE_CTRL to tune a fine frequency component of the oscillation frequency. An example of the operation of the frequency tuner 610 will be described further below with reference to FIG. 7.

An injector 620 may include an amplifier (for example, a signal magnitude adjuster), a low-pass filter (LPF) 621, a capacitive divider 622, an injection controller 623, and a mode switch 624 (for example, an ON/OFF switch). The amplifier amplifies an input signal. The LPF 621 filters the input signal with a low band. The capacitive divider 622 divides a voltage of the low-pass filtered input signal. The injector 620 generates a feed signal from the input signal through the LPF 621 and the capacitive divider 622. The mode switch 624 controls feeding of the low-pass filtered feed signal with respect to the oscillator. For example, the mode switch 624 may feed the feed signal to the oscillator 640 or restrict the feeding based on a control of the injection controller 623. The injection controller 623 restricts an enablement of the feed signal before the tuning of the oscillation frequency is completed, and allows the enablement of the feed signal after the tuning of the oscillation frequency is completed.

A gate 630 may include a clock gate 631 and an oscillation gate 632. The clock gate 631 restricts a supply of a carrier frequency to the frequency tuner 610 in response to the tuning of the oscillation frequency being completed. The oscillation gate 632 restricts the supply of the oscillation frequency with respect to the frequency tuner 610 in response to the tuning of the oscillation frequency being completed. An example of the clock gate 631 will be described further with reference to FIG. 11. The oscillation gate 632 may be configured similar to the clock gate 631.

The oscillator 640 may include an internal oscillator 641 and an oscillation controller 642. The oscillation controller 642 may control a capacitance and a bias current of the internal oscillator 641 based on the control bit received from the frequency tuner 610 and the feed signal fed through the injector 620. The internal oscillator 641 may generate an oscillation signal with an oscillation frequency determined by the oscillation controller 642. Although FIG. 6 illustrates the internal oscillator 641 and the oscillation controller 642 as separate blocks, examples are not limited thereto. The internal oscillator 641 and the oscillation controller 642 may be implemented to be integrated depending on a design. An example of the oscillator 640 will be described further below with reference to FIG. 11.

A clock adjuster 645 may transfer the reference clock signal generated by the oscillator 640 to a communicator 650, as described above. For example, the clock adjuster 645 may bypass the reference clock signal to the communicator 650 as is, or divide the reference clock signal, thereby transferring the generated target clock signal to the communicator 650.

A switch 651 may switch a transmission mode and a reception mode of the communicator 650.

The communicator 650 may perform communication using the reference clock signal and/or the target clock signal.

A DBB unit 660 may transfer a digital signal to the communicator 650.

A matcher 691 may match impedances between an antenna 690 and the other modules.

The antenna 690 may receive the input signal from an external device. Further, the antenna 690 may transmit a data signal modulated by the communicator 650 to the external device.

Figure 7:
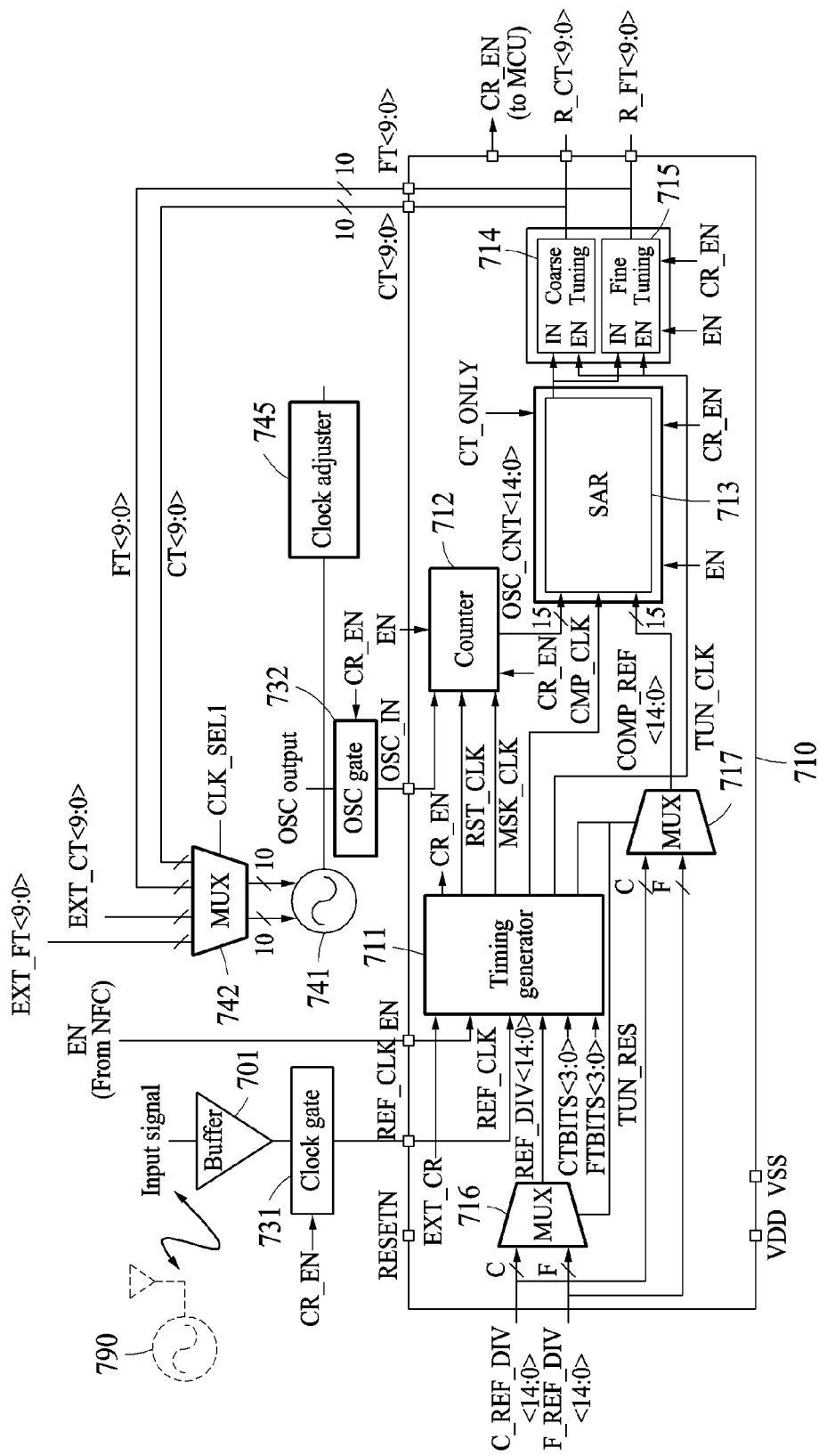
FIG. 7 illustrates an example of a frequency tuner.

FIG. 7 illustrates an example of a frequency tuner.

A clock frequency supply device may receive an input signal from an external terminal 790. FIG. 7 illustrates an operation of performing a frequency tuning operation.

First, the clock frequency supply device may transfer the input signal to a clock gate 731 through a buffer 701. The clock gate 731 may transfer the input signal to a frequency tuner 710. In FIG. 7, the input signal is denoted as REF_CLK.

The frequency tuner 710 may include a timing generator 711, a counter 712, a successive approximation registerer (SAR) 713, a first tuning controller 714, a second tuning controller 715, a first multiplexer (MUX) 716, and a second MUX 717.

The timing generator 711 may generate a timing signal using the input signal. The timing signal is a signal to operate the counter 712, the SAR 713, the first tuning controller 714, and the second tuning controller 715. The timing signal may include, for example, MSK_CLK, CMP_CLK, and TUN_CLK. The timing generator 711 operates while an enablement signal (denoted as EN in FIG. 7) is given. For example, the timing generator 711 divides the input signal REF_CLK based on REF_DIV<14:0>, CTBITS<3:0>, and FTBITS<3:0>. REF_DIV<14:0> is a 15-bit division reference signal. REF_DIV<14:0> is generated from C_REF_DIV<14:0> and F_REF_DIV<14:0> by the first MUX 716. C_REF_DIV<14:0> and F_REF_DIV<14:0> are each a 15-bit signal, which is a signal to control a coarse portion and a fine portion of the division reference signal. CTBITS<3:0> and FTBITS<3:0> are each a 4-bit signal, which is a signal to control the first tuning controller 714 and the second tuning controller 715. Further, the timing generator 711 may generate CR_EN as a clock calibration signal. CR_EN is a signal to enable an operation of the frequency tuner 710.

VDD and VSS denote supplied voltages provided to the frequency tuner 710.

The counter 712 may count an oscillation count of an internal oscillator 741 during a mask time. The counted oscillation count may be used for the first tuning controller 714 and the second tuning controller 715 to determine control bits. The counter 712 may transfer an oscillation count signal (denoted as 15-bit OSC_CNT<14:0> in FIG. 7) related to the counted oscillation count to the SAR 713.

The SAR 713 may transfer signals to control the first tuning controller 714 and the second tuning controller 715 based on the counted oscillation count and a reference oscillation count (denoted as 15-bit COMP_REF<14:0> in FIG. 7). The reference oscillation count may be generated by the second MUX 717. For example, the SAR 713 determines whether to increase (for example, UP) or decrease (for example, DN) a capacitance based on a result of comparing a counted target oscillation count to the reference oscillation count. When a CT_ONLY signal is enabled, the SAR 713 controls only the first tuning controller 714.

The first tuning controller 714 may coarsely tune an oscillation frequency of the internal oscillator 741 based on a carrier frequency and the oscillation frequency. For example, the first tuning controller 714 determines a bit value within a first bit range (for example, a coarse bit) among control bits to control the oscillation frequency based on a result of comparing a target oscillation count counted during a coarse mask time corresponding to the oscillation frequency to the reference oscillation count corresponding to the carrier frequency. Outputs of the first tuning controller 714 are denoted as 10-bit R_CT<9:0> and 10-bit CT<9:0> in FIG. 7. For reference, the first tuning controller 714 controls a bias current of an oscillator 740. An example of the operation of the first tuning controller 714 will be described further below with reference to FIG. 8.

The second tuning controller 715 finely tunes the oscillation frequency of the internal oscillator 741 based on the carrier frequency and the oscillation frequency. The second tuning controller 715 determines a bit value within a second bit range (for example, a fine bit) among control bits to control the oscillation frequency based on a result of comparing a target oscillation count counted during a fine mask time corresponding to the oscillation frequency to the reference oscillation count corresponding to the carrier frequency. Outputs of the second tuning controller 715 are denoted as 10-bit R_FT<9:0> and 10-bit FT<9:0> in FIG. 7. For reference, the second tuning controller 715 controls the capacitance of the oscillator 740. An example of the operation of the second tuning controller 715 will be described further below with reference to FIG. 9.

Herein, the first bit range indicates bit positions greater than a reference bit position, and the second bit range indicates bit positions less than or equal to the reference bit position. For example, in FIG. 7, 0-th to 9-th bit positions from LSB belong to the second bit range. 10-th to 19-th bit positions from LSB belong to the first bit range.

A third MUX 742 controls a capacitance of the internal oscillator 741 based on the control bits determined by the first tuning controller 714 and the second tuning controller 715. EXT_CT<9:0> and EXT_FT<9:0> are external control signals to control a capacitance corresponding to a coarse bit and a capacitance corresponding to a fine bit.

The internal oscillator 741 may generate an oscillation signal OSC output with an oscillation frequency. The oscillation frequency of the internal oscillator 741 corresponds to a capacitance corresponding to the control bit determined by the frequency tuner 710.

An oscillation gate 732 provides the frequency tuner 710 with the oscillation signal while performing the frequency tuning operation.

A clock adjuster 745 may generate a target clock signal from the oscillation signal and may transfer the target clock signal to a communicator after frequency tuning is completed.

FIG. 7 illustrates an exemplary configuration of the frequency tuner 710, and types of signals and bits of the signals are not limited thereto and may be changed depending on a design.

The frequency tuner 710 tunes the oscillation frequency of the oscillator to minimize a frequency difference between the carrier frequency and the oscillation frequency. For example, the frequency tuner 710 tunes the oscillation frequency by changing at least one of the capacitance of the oscillator and the bias current flowing in the oscillator.

Figure 8:
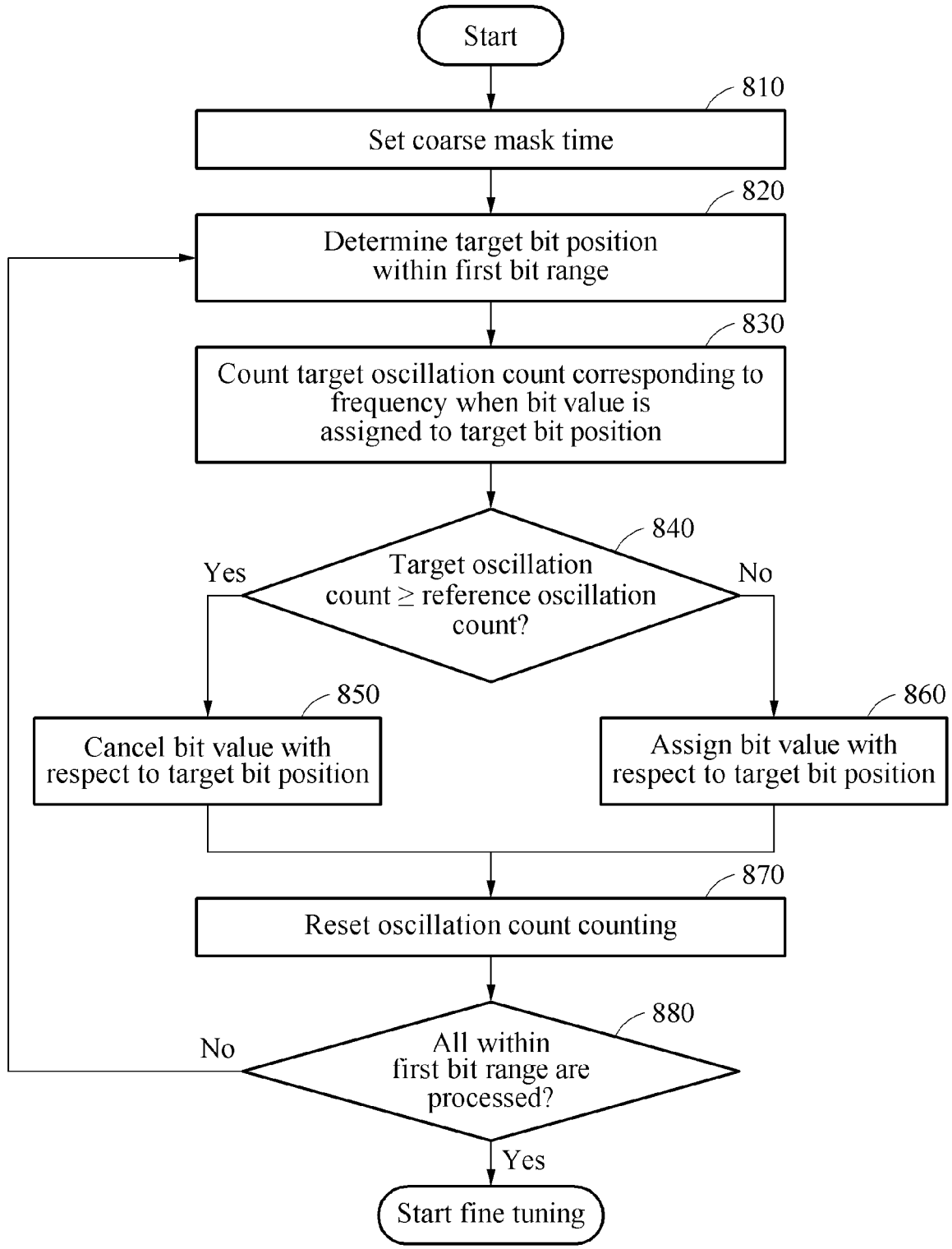
FIGS. 8 and 9 illustrate examples of an operation of a frequency tuner.
Figure 9:
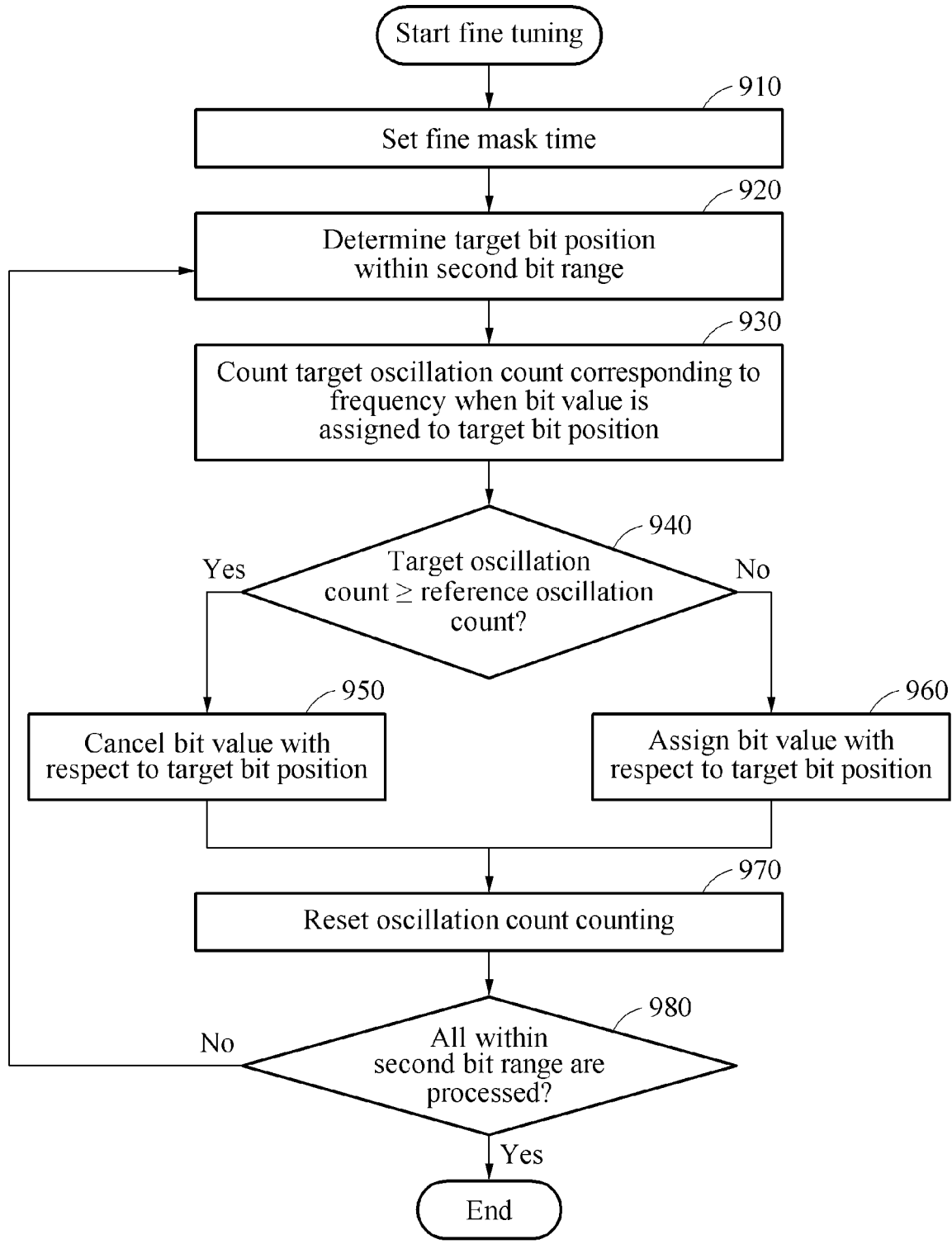

FIGS. 8 and 9 illustrate examples of an operation of a frequency tuner.

FIG. 8 describes a method of determining a bit value at a coarse bit position among control bits to control a capacitance of an oscillator.

First, in operation 810, a clock frequency supply device may set a coarse mask time. For example, a timing generator may designate the coarse mask time.

In operation 820, the clock frequency supply device determines a target bit position within a first bit range. The clock frequency supply device determines a bit value corresponding to each target bit position while sequentially changing a target bit position from MSB among bit positions belonging to the first bit range.

In operation 830, a counter counts a target oscillation count corresponding to a frequency when a bit value corresponding to the target bit position is assigned. For example, the counter counts a number of times an oscillation signal received from an oscillator oscillates during the coarse mask time.

In operation 840, an SAR compares the target oscillation count to a reference oscillation count.

In operation 850, a first tuning controller cancels the bit value with respect to the target bit position in response to the target oscillation count being greater than or equal to the reference oscillation count. For example, the first tuning controller assigns "0" to the bit value with respect to the target bit position.

In operation 860, the first tuning controller assigns the bit value with respect to the target bit position in response to the target oscillation count being less than the reference oscillation count. For example, the first tuning controller assigns "1" to the bit value with respect to the target bit position.

In operation 870, the clock frequency supply device resets oscillation count counting of the count.

In operation 880, the clock frequency supply device determines whether bit values within the first bit range among the control bits are all processed. In response to determination that the bit values within the first bit range are all processed, the clock frequency supply device starts fine tuning of FIG. 9. When there are bit values yet to be processed within the first bit range, the clock frequency supply device determines a bit position lower than a current target bit position to be the target bit position and repeats the above process, starting from operation 820.

FIG. 9 describes a method of determining a bit value of a fine bit position among the control bits to control the capacitance of the oscillator.

First, in operation 910, the clock frequency supply device sets a fine mask time. For example, the timing generator designates the fine mask time.

In operation 920, the clock frequency supply device determines a target bit position within a second bit range. The clock frequency supply device determines a bit value corresponding to each target bit position while sequentially changing a target bit position from MSB among bit positions belonging to the second bit range.

In operation 930, the counter counts a target oscillation count corresponding to a frequency when a bit value corresponding to the target bit position is assigned. For example, the counter counts a number of times an oscillation signal received from an oscillator oscillates during the fine mask time.

In operation 940, the SAR compares the target oscillation count to a reference oscillation count.

In operation 950, a second tuning controller cancels the bit value with respect to the target bit position in response to the target oscillation count being greater than or equal to the reference oscillation count. For example, the second tuning controller assigns "0" to the bit value with respect to the target bit position.

In operation 960, the second tuning controller assigns the bit value with respect to the target bit position in response to the target oscillation count being less than the reference oscillation count. For example, the second tuning controller assigns "1" to the bit value with respect to the target bit position.

In operation 970, the clock frequency supply device resets oscillation count counting of the count.

In operation 980, the clock frequency supply device determines whether bit values within the second bit range among the control bits are all processed. In response to determination that the bit values within the second bit range are all processed, the clock frequency supply device determines that frequency tuning is completed. When there are bit values yet to be processed within the second bit range, the clock frequency supply device determines a bit position lower than a current target bit position to be the target bit position and repeats the above process, starting from operation 920.

Hereinafter, an example of the oscillation frequency tuning described in FIGS. 8 and 9 will be described with reference to FIG. 10.

Figure 10:
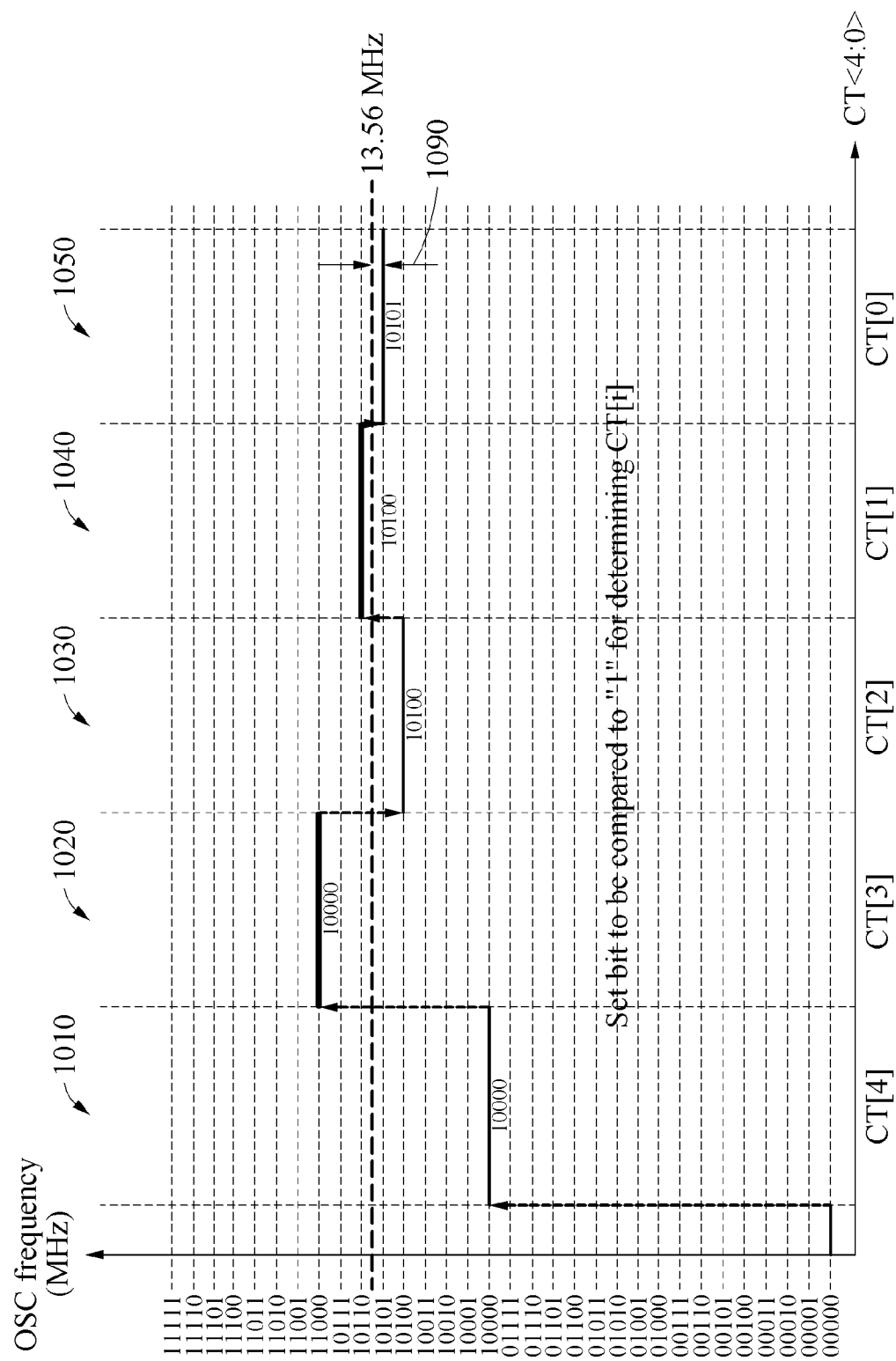
FIG. 10 illustrates an example of an oscillation frequency tuned by a frequency tuner.

FIG. 10 illustrates an example of an oscillation frequency tuned by a frequency tuner.

In FIG. 10, a vertical axis indicates an oscillation frequency and a control code corresponding thereto. A horizontal axis indicates a bit position of the control code. FIG. 10 describes a process of determining a 5-bit control code.

First, a frequency tuner determines a fourth bit position (for reference, corresponding to a bit position being MSB in FIG. 10) from LSB in a first period 1010 to be a target bit position. With respect to the target bit position, the frequency tuner transfers a control code of "10000" to an oscillator. The oscillator oscillates at an oscillation frequency corresponding to "10000", and the frequency tuner counts a target oscillation count corresponding to the control code of "10000" during a mask time. The frequency tuner compares the target oscillation count corresponding to "10000" to a reference oscillation count corresponding to a carrier frequency. In FIG. 10, since the target oscillation count corresponding to "10000" is less than or equal to the reference oscillation count, the frequency tuner determines a bit value with respect to the fourth bit position CT[4] from LSB to be "1". For example, the frequency tuner may determine that a control code having a CT[4] bit value of "1" will result in a target oscillation count closer in value to the reference oscillation count than a control code having a CT[4] bit value of "0".

In a second period 1020, the frequency tuner transfers a control code of "11000" to the oscillator and counts a target oscillation count corresponding to "11000". Since the target oscillation count corresponding to "11000" is greater than the reference oscillation count, as shown in FIG. 10, the frequency tuner determines a bit value with respect to a third bit position CT[3] to be "0". For example, the frequency tuner may determine that a control code having respective CT[4], CT[3] bit values of "1", "0" will result in a target oscillation count closer in value to the reference oscillation count than a control code having respective CT[4], CT[3] bit values of "1", "1".

In a third period 1030, the frequency tuner transfers a control code of "10100" to the oscillator and counts a target oscillation count corresponding to "10100". Since the target oscillation count corresponding to "10100" is less than or equal to the reference oscillation count, as shown in FIG. 10, the frequency tuner determines a bit value with respect to a second bit position CT[2] to be "1". For example, the frequency tuner may determine that a control code having respective CT[4], CT[3], CT[2] bit values of "1", "0", "1" will result in a target oscillation count closer in value to the reference oscillation count than a control code having respective CT[4], CT[3], CT[2] bit values bit values of "1", "0", "0".

In a fourth period 1040, the frequency tuner transfers a control code of "10110" to the oscillator and counts a target oscillation count corresponding to "10110". Since the target oscillation count corresponding to "10110" is greater than the reference oscillation count, as shown in FIG. 10, the frequency tuner determines a bit value with respect to a first bit position CT[1] to be "0". For example, the frequency tuner may determine that a control code having respective CT[4], CT[3], CT[2], CT[1] bit values of "1", "0", "1", "0" will result in a target oscillation count closer in value to the reference oscillation count than a control code having respective CT[4], CT[3], CT[2], CT[1] bit values bit values of "1", "0", "1", "1".

Last, in a fifth period 1050, the frequency tuner transfers a control code of "10101" to the oscillator and counts a target oscillation count corresponding to "10101". Since the target oscillation count corresponding to "10101" is less than or equal to the reference oscillation count, the frequency tuner determines a bit value with respect to a zeroth bit position CT[0] to be "1". For example, the frequency tuner may determine that a control code of "10101" will result in a target oscillation count closer in value to the reference oscillation count than a control code of "10100". Thus, the control code is finally adjusted to "10101".

Consequently, in FIG. 10, the frequency tuner determines control bits of "10101" with respect to the carrier frequency (for example, 13.56 MHz, a frequency belonging to an NFC band) and transfers the control bits to the oscillator. A frequency error 1090 between the tuned oscillation frequency and the carrier frequency corresponds to a size corresponding to the control bit of LSB.

Figure 11:
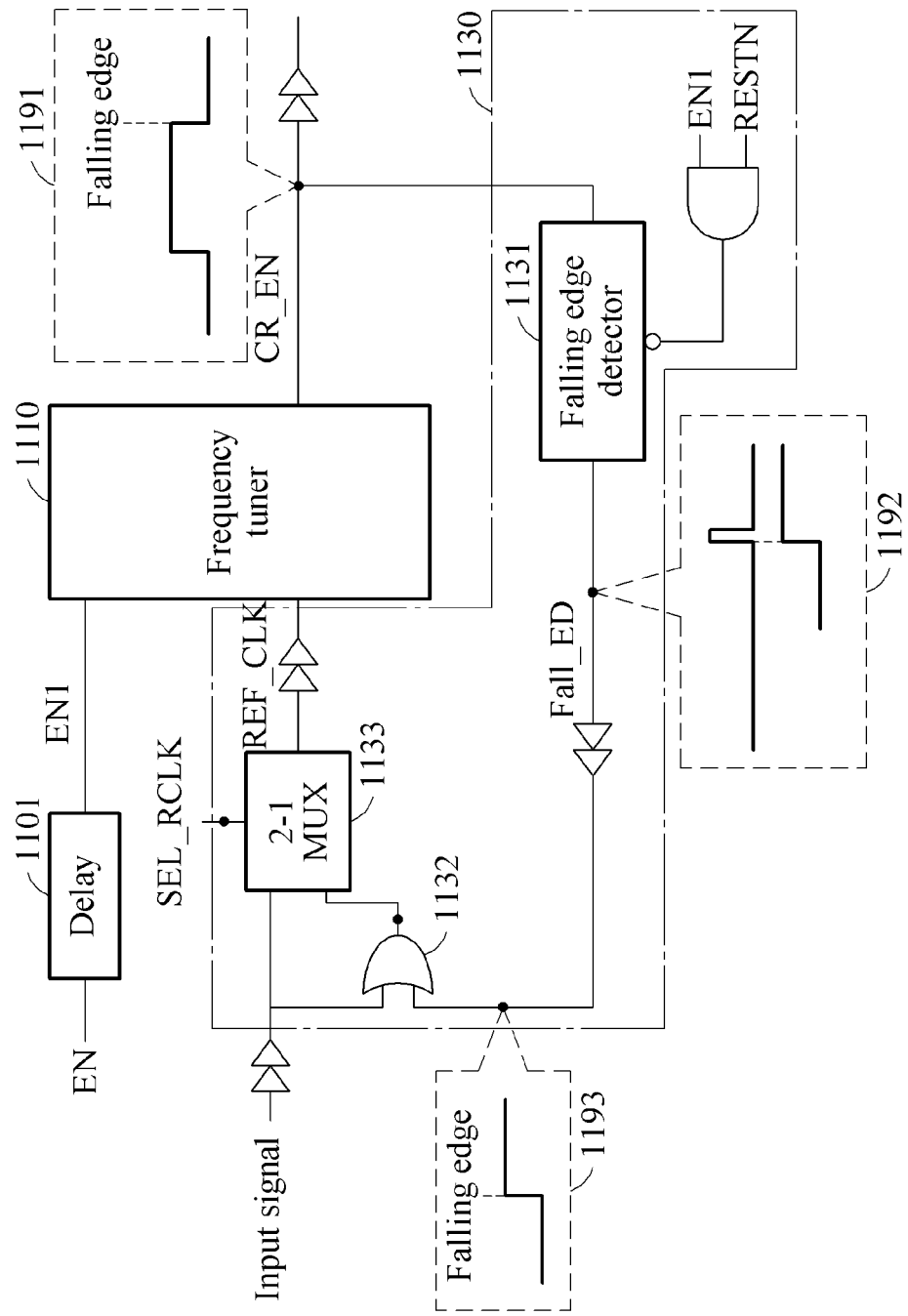
FIG. 11 illustrates an example of a gate.

FIG. 11 illustrates an example of a gate.

A clock gate 1130 may activate or deactivate a frequency tuner 1110 based on a clock enablement signal CR_EN output by the frequency tuner 1110. For example, the gate may activate the frequency tuner 1110 while the clock enablement signal CR_EN is enabled, and may deactivate the frequency tuner 1110 when the enablement is canceled.

First, the frequency tuner 1110 operates in response to a signal EN1 corresponding to a signal EN delayed by a delayer 1101. The frequency tuner 1110 operates based on a signal provided by the clock gate 1130. The frequency tuner 1110 changes the clock enablement signal CR_EN to OFF as shown in a box 1191 of FIG. 11 when tuning of a frequency of an oscillator is completed.

A falling edge detector 1131 of the clock gate 1130 detects a falling edge in the clock enablement signal CR_EN. For example, the falling edge detector 1131 may generate signals 1192 and 1193 fixed to "1" after the falling edge. An OR gate 1132 may transfer, to a 2-1 MUX 1133, OR operation results with respect to the signals 1192 and 1193 fixed to "1" after the failing edge and an input signal. Thus, the 2-1 MUX 1133 may transfer REF_CLK with a carrier frequency to the frequency tuner 1110 until a falling edge occurs in the clock enablement signal CR_EN, and may transfer a gated clock, for example, a signal fixed to H, to the frequency tuner 1110 after a falling edge occurs.

Although not shown in the drawings, an oscillation gate may be configured similar to the clock gate 1130.

Figure 12:
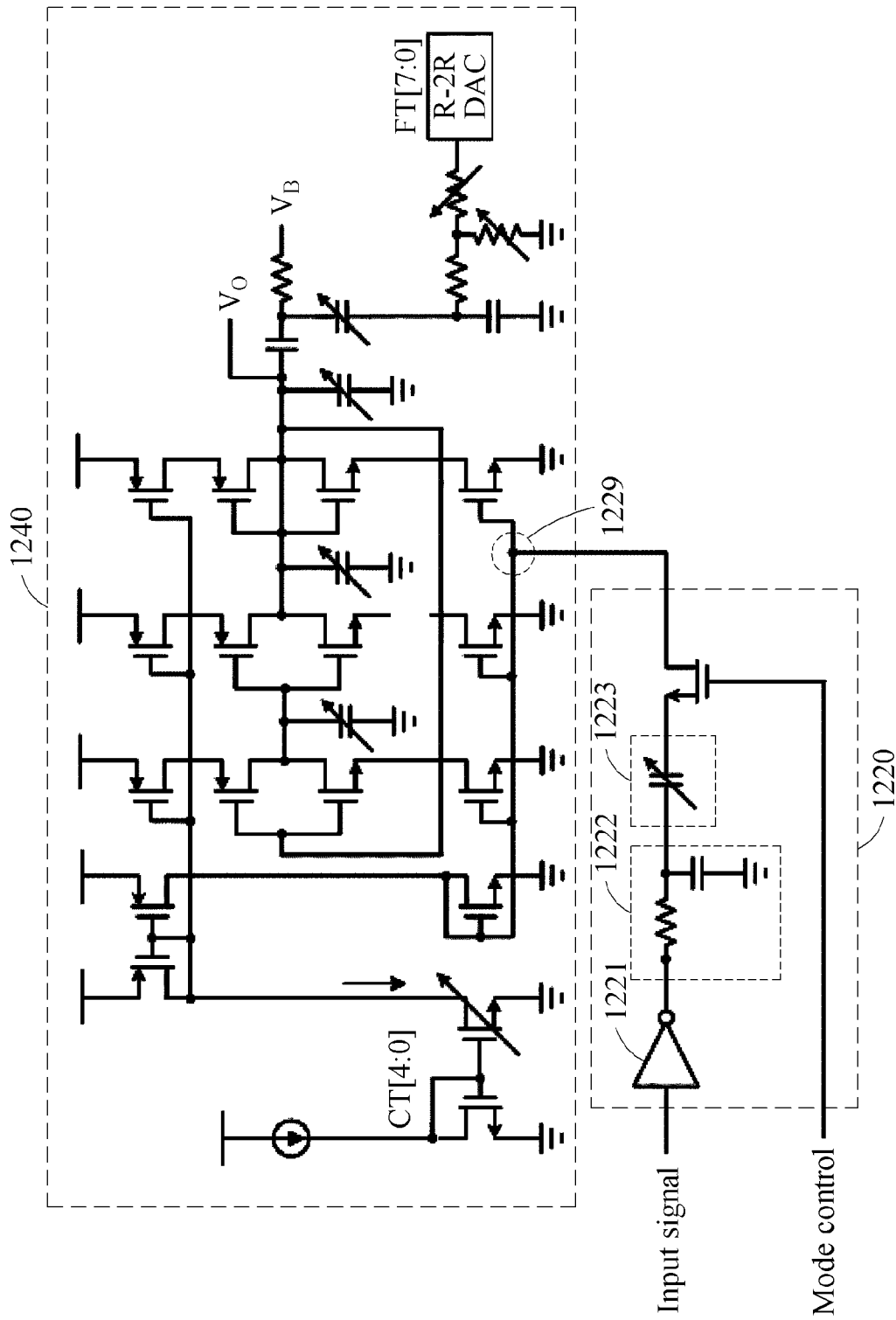
FIG. 12 illustrates an example of an oscillator and an injector.
Figure 13:
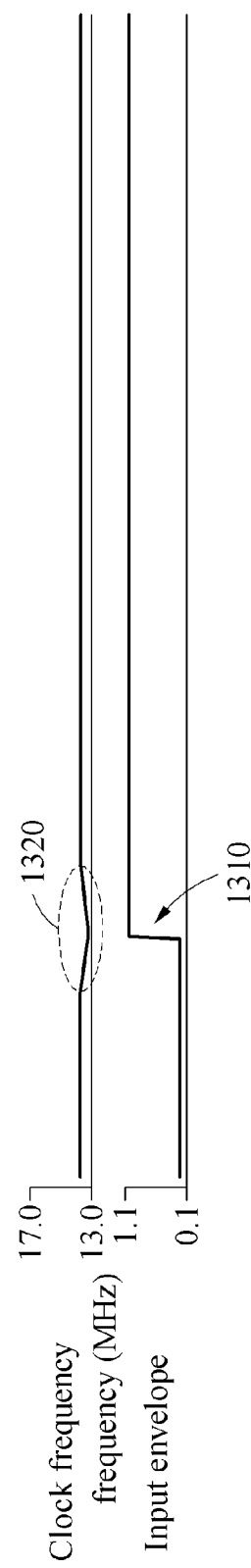
FIG. 13 illustrates an example of stable frequency maintenance of a clock frequency supply device.

FIG. 12 illustrates an example of an oscillator and an injector. FIG. 13 illustrates an example of stable frequency maintenance of a clock frequency supply device.

An oscillator 1240 is implemented in a 3-ring stage oscillation structure as shown in FIG. 12. Among control bits transferred to the oscillator 1240, a coarse bit is used to control a bias current. Among the control bits, a fine bit is used to control a capacitance of a metal oxide semi-conductor (MOS) varactor. Further, the clock frequency supply device controls a capacitor load and a current bias through an offset control. In FIG. 12, CT[4:0] is a 5-bit control code to control the coarse bit, and FT[7:0] is an 8-bit control code to control the fine bit.

An injector 1220 feeds a feed signal to a bias current control node 1229 of the oscillator 1240. The bias current control node 1229 is a node associated with a bias current supplied to the oscillator 1240. The injector 1220 may include a filter 1222 configured to generate the feed signal through low-pass filtering on an input signal and feed the feed signal to the oscillator 1240. The filter 1222 may include a resistance, e.g., a resistor, connected in series between an antenna and the oscillator 1240, and a capacitor connected in parallel to the example resistor. The injector 1220 further may include an amplifier 1221, a capacitive divider 1223, and a mode switch.

As described above, the injector 1220 does not apply the feed signal to the oscillator 1240 in a frequency calibration mode and feeds the feed signal to the oscillator 1240 in an injection locking mode, through mode switching. Further, in the injection locking mode, the clock frequency supply device locks an oscillation frequency to a carrier frequency or operates the oscillator 1240 at a free running frequency, based on an amplitude of the input signal. For example, the oscillator 1240 generates a reference clock signal with a reference clock frequency locked to the carrier frequency of the input signal while a magnitude of an envelope of the input signal is greater than a threshold value. Further, the oscillator 1240 generates a reference clock signal with a free running frequency while the magnitude of the envelope of the input signal is less than or equal to the threshold value. For example, in a free running mode, the oscillator 1240 generates the reference clock signal with the free running frequency through free running in a frequency configuration tuned by a frequency tuner.

FIG. 13 illustrates a situation 1310 in which a logical state of an input envelope transitions from L to H. When the logical state of the input envelope is H, an oscillation frequency is locked to a carrier frequency. When the logical state of the input envelope is L, the oscillator 1240 performs a free running operation. The clock frequency supply device feeds a feed signal generated by low-pass filtering the input signal to the oscillator 1240, thereby minimizing a frequency change 1320 occurring when switching between the injection locking operation and the free running frequency operation, as shown in FIG. 13. Thus, the clock frequency supply device prevents a glitch or a frequency shift occurring during the logical state transition.

Hence, the clock frequency supply device secures a phase noise characteristic and a jitter characteristic of an oscillator at a level similar to that of a PLL.

The clock frequency supply devices, clock frequency supply devices 100 and 300, frequency tuners, frequency tuners 110, 310, 610, 710, 1110, injectors, injectors, 120, 320, 620, 720, 1120, oscillators, oscillators 140, 340, 640, 740, and other apparatuses, units, modules, devices, and other components described herein with respect to FIGS. 1-13 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-13 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions used herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A clock frequency supply device, comprising:
   an oscillator;
   a frequency tuner configured to receive an input signal with a carrier frequency, and tune an oscillation frequency of the oscillator based on the carrier frequency; and an injector configured to inject the input signal directly into the oscillator after the tuning of the oscillation frequency is completed, wherein the oscillator is configured to generate a reference clock signal with a reference clock frequency based on the injected input signal, wherein the injector comprises:

a mode switch configured to control feeding of a feed signal generated from the input signal with respect to the oscillator; and an injection controller configured to restrict an enablement of the feed signal before the tuning of the oscillation frequency is completed, and to allow the enablement of the feed signal after the tuning of the oscillation frequency is completed.

2. The device of claim 1, further comprising:

a gate configured to deactivate the frequency tuner in response to the tuning of the oscillation frequency of the oscillator being completed.

3. The device of claim 2, wherein, for the deactivating of the frequency tuner, the gate is configured to restrict a supply of the carrier frequency to the frequency tuner in response to the tuning of the oscillation frequency being completed.

4. The device of claim 1, wherein, for the generating of the reference clock signal, the oscillator is further configured to generate the reference clock signal to have a reference clock frequency locked to the carrier frequency of the input signal, while a magnitude of an envelope of the input signal is greater than a threshold value.

5. The device of claim 1, wherein, for the generating of the reference clock signal, the oscillator is further configured to generate the reference clock signal to have a free running frequency through free running in a frequency configuration tuned by the frequency tuner, while a magnitude of an envelope of the input signal is less than or equal to a threshold value.

6. The device of claim 1, wherein the injector further comprises a signal magnitude adjuster configured to adjust a magnitude of the input signal, and the mode switch is further configured to control feeding of the feed signal that is low pass filtered to the oscillator.

7. The device of claim 6, wherein the injector is further configured to feed the feed signal to a bias current control node of the oscillator.

8. The device of claim 6, wherein the injector further comprises:

a resistor connected in series between an antenna and the oscillator; and a capacitor connected in parallel to the resistor.

9. The device of claim 6, wherein the injector further comprises an amplifier and a capacitive divider.

10. The device of claim 1, wherein, for the tuning of the oscillation frequency, the frequency tuner is further configured to tune the oscillation to minimize a frequency difference between the carrier frequency and the oscillation frequency.

11. The device of claim 1, wherein the frequency tuner comprises:

a first tuning controller configured to coarsely tune the oscillation frequency of the oscillator based on the carrier frequency and the oscillation frequency; and a second tuning controller configured to finely tune the oscillation frequency of the oscillator based on the carrier frequency and the oscillation frequency.

12. The device of claim 11, wherein the first tuning controller is further configured to determine a bit value within a first bit range among control bits to control the oscillation frequency based on a result of comparing a target oscillation count counted during a coarse mask time corresponding to the oscillation frequency to a reference oscillation count corresponding to the carrier frequency.

13. The device of claim 11, wherein the second tuning controller is further configured to determine a bit value within a second bit range among control bits to control the oscillation frequency based on a result of comparing a target oscillation count counted during a fine mask time corresponding to the oscillation frequency to a reference oscillation count corresponding to the carrier frequency.

14. The device of claim 1, wherein, for the tuning of the oscillation frequency, the frequency tuner is further configured to tune the oscillation frequency by changing either one or both of a capacitance of the oscillator and a bias current flowing in the oscillator.

15. The device of claim 1, wherein, for the tuning of the oscillation frequency, the frequency tuner is further configured to tune the oscillation frequency to the carrier frequency before a data signal is received.

16. The device of claim 1, further comprising:

a clock adjuster configured to provide a communicator with either one or both of the reference clock signal and a target clock signal generated by tuning the reference clock frequency of the reference clock signal to a target clock frequency.

17. The device of claim 1, further comprising:

a communicator configured to receive a data signal after the tuning of the oscillation frequency is completed.

18. The device of claim 17, wherein the communicator is further configured to transmit and receive the data signal through a near field communication (NFC) band.

19. The device of claim 1, wherein the frequency tuner receives the input signal from an antenna.

20. The device of claim 1, wherein the injector is further configured to lock the oscillation frequency to the carrier frequency during a first period in which a magnitude of an envelope of the input signal is greater than a threshold value, and perform a free running operation during a second period in which the magnitude of the envelope is less than the threshold value, and the second period is shorter than the first period.

21. The device of claim 20, wherein the injector is further configured to repeat the locking of the oscillation frequency and the performing of the free running operation.

22. The device of claim 20, wherein the locking of the oscillation frequency occurs during an injection locking mode, and the free running operation occurs when the injection locking mode is switched to a free running mode.

23. A clock frequency supply method, comprising:

receiving an input signal with a carrier frequency;

tuning an oscillation frequency of an oscillator based on the carrier frequency;

injecting the input signal directly into the oscillator after the tuning of the oscillation frequency is completed; and generating a reference clock signal with a reference clock frequency based on the injected input signal, wherein the injecting comprises:

controlling, by a mode switch, feeding of a feed signal generated from the input signal with respect to the oscillator;

restricting an enablement of the feed signal before the tuning of the oscillation frequency is completed; and allowing the enablement of the feed signal after the tuning of the oscillation frequency is completed.

24. A clock frequency supply method, comprising:
receiving an input signal with a carrier frequency;
controlling, by a mode switch, feeding of a feed signal generated from the input signal with respect to an oscillator;
restricting an enablement of the feed signal before tuning of an oscillation frequency of the oscillator is completed;
tuning the oscillation frequency based on the carrier frequency;
injection locking the oscillation frequency to the carrier frequency to generate a reference clock signal, in response to the tuning of the oscillation frequency being completed; and
allowing the enablement of the feed signal after the tuning of the oscillation frequency is completed.

25. The method of claim 23, wherein the injecting comprises injecting the input signal into the oscillator while the frequency tuner is being deactivated.

26. The method of claim 23, wherein the generating of the reference clock signal comprises generating the reference clock signal to have a frequency tuned to the carrier frequency during a time period in which a carrier of the input signal is not present.

27. The method of claim 23, wherein the tuning of the oscillation frequency comprises:
tuning the oscillator to a first target oscillation frequency by transferring a control bit sequence to the oscillator;
comparing a reference oscillation count corresponding to the carrier frequency to an oscillation count of the oscillator which is oscillating at the target oscillation frequency;
adjusting the control bit sequence based on a result of the comparing; and
tuning the oscillator to a second target oscillation frequency by transferring the adjusted control bit sequence to the oscillator.

\* \* \* \* \*